US012267664B2

(12) United States Patent
Rodman et al.

(10) Patent No.: US 12,267,664 B2
(45) Date of Patent: Apr. 1, 2025

(54) VIRTUAL AND MIXED REALITY AUDIO SYSTEM ENVIRONMENT CORRECTION

(71) Applicant: Sound United LLC, Carlsbad, CA (US)

(72) Inventors: Jonathan Rodman, Parkville, MD (US); Bradley M. Starobin, Baltimore, MD (US)

(73) Assignee: SOUND UNITED LLC, Carlsbad, CA (US)

( * ) Notice: Subject to any disclaimer, the term of this patent is extended or adjusted under 35 U.S.C. 154(b) by 0 days.

(21) Appl. No.: 17/571,861

(22) Filed: Jan. 10, 2022

(65) Prior Publication Data

US 2023/0224667 A1    Jul. 13, 2023

(51) Int. Cl.
  H04S 7/00     (2006.01)
  H03F 3/183    (2006.01)
  H04R 1/40     (2006.01)
  H04R 3/00     (2006.01)
  H04R 5/02     (2006.01)
  H04R 5/033    (2006.01)
  H04R 5/04     (2006.01)
  H04S 3/00     (2006.01)

(52) U.S. Cl.
  CPC ............. *H04S 7/304* (2013.01); *H03F 3/183* (2013.01); *H04R 1/406* (2013.01); *H04R 3/005* (2013.01); *H04R 5/02* (2013.01); *H04R 5/033* (2013.01); *H04R 5/04* (2013.01); *H04S 3/008* (2013.01); *H04S 7/301* (2013.01); *H03F 2200/03* (2013.01); *H04R 2201/401* (2013.01); *H04R 2499/15* (2013.01); *H04S 2400/01* (2013.01); *H04S 2400/15* (2013.01)

(58) Field of Classification Search
  CPC .......... H04S 3/008; H04S 7/304; H04S 7/301; H04S 2400/01; H04S 2400/15; H03F 3/183; H03F 2200/03; H04R 2499/15; H04R 1/406; H04R 3/005; H04R 5/02; H04R 5/033; H04R 5/04; H04R 2201/401
  USPC .......... 381/1, 56, 58, 59, 303, 306, 307, 310
  See application file for complete search history.

(56) References Cited

U.S. PATENT DOCUMENTS 8,194,874 B2   6/2012   Starobin et al.
9,641,952 B2   5/2017   Fejzo et al.
(Continued)

*Primary Examiner* — William A Jerez Lora
(74) *Attorney, Agent, or Firm* — Nieves IP Law Group, LLC; Peter A. Nieves

(57) ABSTRACT

A virtual reality (VR), augmented reality (AR) and/or mixed reality (MR) system in a physical environment with a plurality of loudspeakers includes a user-worn head mounted display (HMD), a VR/AR/MR processor, and a VR/AR/MR user tracking processor. The HMD includes a microphone and a user tracking device configured to track a user orientation and position. The VR/AR/MR processor delivers a digital video signal to the head-mounted display, and a digital control signal and a digital audio signal to a receiver/preamplifier. The VR/AR/MR user tracking processor receives user tracking data from the HMD user tracking device and provides a digital user tracking data signal to the receiver preamplifier. the receiver/preamplifier receives the digital user tracking data signal, the digital control signal, the digitized microphone signal, and the digital audio signal, and provides a processed audio signal to the amplifier. An amplifier receives the processed audio signal and provides amplified audio signals.

5 Claims, 12 Drawing Sheets

(56) References Cited

U.S. PATENT DOCUMENTS

| | | | |
|---|---|---|---|
| 10,390,003 B1 | 8/2019 | Liu et al. | |
| 10,412,527 B1 | 9/2019 | Miller et al. | |
| 2007/0242834 A1 | 10/2007 | Coutinho et al. | |
| 2015/0230041 A1 | 8/2015 | Fejzo et al. | |
| 2016/0006879 A1* | 1/2016 | Dickins | H04M 3/568 |
| | | | 379/406.03 |
| 2017/0005574 A1* | 1/2017 | Wyland | H02M 3/158 |
| 2018/0034867 A1* | 2/2018 | Zahn | G06F 3/011 |
| 2019/0116448 A1 | 4/2019 | Schmidt et al. | |
| 2019/0195979 A1 | 6/2019 | Bucknor et al. | |
| 2020/0008003 A1* | 1/2020 | Thompson | G06F 3/165 |
| 2020/0236456 A1* | 7/2020 | Gallo | H04R 1/1008 |
| 2020/0245085 A1 | 7/2020 | Starobin et al. | |
| 2021/0044916 A1 | 2/2021 | Robinson et al. | |

\* cited by examiner

VIRTUAL AND MIXED REALITY AUDIO SYSTEM ENVIRONMENT CORRECTION

FIELD OF THE INVENTION

The present invention relates to mixed media virtual reality environments, and more particularly, is related to an audio system and methods for a wearer of a virtual reality headset.

BACKGROUND OF THE INVENTION

Virtual and mixed reality audio systems that utilize multiple channels of loudspeakers may be experienced in environments that distort (for example, attenuate) acoustic content via reflection, absorption, diffusion, and delay. These environmental distortions can affect the user's perception of the acoustic image and the spectral balance of the virtual and/or mixed reality content in a manner unintended by the content creators. For home audio applications that are intended for music, movies, television, and video games there exist techniques for using a microphone to determine equalization, delay, filtering, and gain adjustments to improve the experience of a stationary listener, for example, as described in U.S. Pat. No. 9,641,952 B2. Virtual and mixed reality systems often utilized user tracking data that is collected from cameras and/or base stations placed in the user environment to simulate motion inside a digital world experienced through a headset device. This tracking data is often utilized to calculate head-related transfer functions that are applied to adaptive digital filters that assist in delivering the simulation of acoustic space as the user moves with their headset device through their environment as described in U.S. patent Ser. No. 10/412,527B1. However, the tracking does not consider the acoustic effects imposed by the space as a user moves within environment.

There are a number of "room correction" systems available to consumers that attempt to address the major effects on in-room, perceived sound quality, especially spectral aspects. While these systems have been proven to be effective, they suffer from a number of compromises. For example, while these systems may effectively improve spectral balance for a single primary listening location, or "sweet spot," they normally fail to do so at other locations and may even degrade audio quality depending on the nature of the "corrections." When a listener moves about the acoustic space, perceived sound quality tends to suffer due to the location dependent nature of room effects. Therefore, there is a need in the industry to address one or more of the abovementioned shortcomings.

SUMMARY OF THE INVENTION

Embodiments of the present invention provide a system, method, and device for virtual and mixed reality audio system correction for location and/or orientation of a user in an environment. Briefly described, the present invention is directed to a virtual reality (VR), augmented reality (AR) and/or mixed reality (MR) system in a physical environment with a plurality of loudspeakers. The system includes a user-worn head mounted display (HMD), a VR/AR/MR processor, and a VR/AR/MR user tracking processor. The HMD includes a microphone and a user tracking device configured to track a user orientation and position. The VR/AR/MR processor delivers a digital video signal to the head-mounted display, and a digital control signal and a digital audio signal to a receiver/preamplifier. The VR/AR/MR user tracking processor receives user tracking data from the HMD user tracking device and provides a digital user tracking data signal to the receiver preamplifier. the receiver/preamplifier receives the digital user tracking data signal, the digital control signal, the digitized microphone signal, and the digital audio signal, and provides a processed audio signal to the amplifier. An amplifier receives the processed audio signal and provides amplified audio signals.

Other systems, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The components in the drawings are not necessarily to scale, emphasis instead being placed upon clearly illustrating the principles of the present invention. The drawings illustrate embodiments of the invention and, together with the description, serve to explain the principles of the invention.

DETAILED DESCRIPTION

Figure 1A:
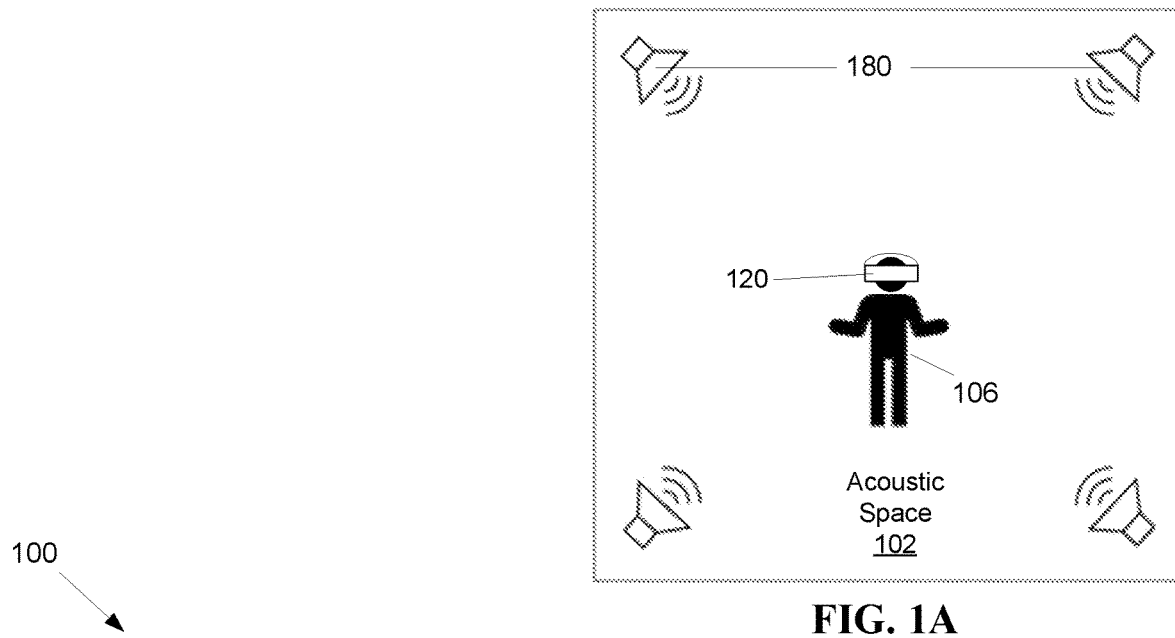
FIG. 1A is a schematic diagram of an acoustic space for a user of a head-mounted display of the first embodiment.

The following definitions are useful for interpreting terms applied to features of the embodiments disclosed herein and are meant only to define elements within the disclosure.

As used within this disclosure, an "acoustic space" refers to a room or physical environment where a user is using a head-mounted display in the proximity of a plurality of loudspeakers and/or headphones.

As used within this disclosure, a "head-mounted display (HMD)" generally refers to a virtual reality, augmented reality, and/or mixed reality device presenting a visual virtual environment to the wearer (user) that is generally different from the physical environment of the user. An HMD device is generally worn on the head of a user or as part of a helmet and includes a small display optic in front of one eye (monocular HMD) or each eye (binocular HMD). An HMD device generally includes a display processor configured to receive a display signal to be provided to the display optic(s). Types of HMDs include virtual reality (VR) devices that display only computer-generated imagery (CGI), referred to as virtual image. Some HMDs allow a CGI to be superimposed on real-world view, referred to as augmented reality (AR) or mixed reality (MR).

As used within this disclosure, a "virtual reality," "augmented reality," and/or "mixed reality" (VR/AR/MR) system refers to a system to produce a computer generated/simulated audio and visual environment where a user wears an HMD device in an acoustic space.

As used within this disclosure, a "surface reflection" generally refers to the reflection by a surface or boundary in an environment of an acoustic waveform produced by one or more transducers (for example, a loudspeaker) within the environment. For example, surfaces and boundaries causing reflections in a room may include room walls, the room ceiling, and the room floor, among others. The surfaces and boundaries in an environment may reflect acoustic energy toward a user of a system in the environment or diffuse (scatter) acoustic energy. Specular reflections and diffusion are typically apparent as variations from the audio source signal in the frequency domain. These variations generally depend on the distance of the user from environmental surfaces and boundaries, as well as their shape and material. These variations may show up as peaks and/or nulls (nodes and/or antinodes) in an acoustic frequency response graph (amplitude vs frequency) and may be smoothed to a target response curve by adjusting parametric equalization parameters such as gain, frequency, and bandwidth (or Q) and/or the application of filters. A variety of filters such as band-pass, notch, high-pass, and low-pass filters with various orders such as first, second, and third may also be used.

As used within this disclosure, a "room mode" generally refers to an acoustic property of an environment (room). In contrast to non-resonant reflections and diffusion, room modes are dependent upon the gross dimensions of the space (length, width, and ceiling height). Room modes, or resonances may collect axially, obliquely, and/or tangentially in a room to cause peaks and/or nulls in a frequency response due to standing waves that are normally most prominent below 200 Hz, depending upon the size and shape of the acoustic space. These modes can be measured in the frequency and time domain. The peaks and/or nulls can be addressed in order to approach a predetermined target curve using parametric equalization parameters such as gain, frequency, and bandwidth (or Q) and/or the application of filters. Generally, room modes may be detected in the frequency domain by seeking narrow band peaks and nulls whose magnitude is sufficiently higher or lower than the mean level within the passband of interest. It should be noted that these techniques are generally more amenable to smoothing peaks as opposed to nulls, since the latter, in extreme cases, behave as acoustic "black holes" in which no amount of additional energy sufficiently smooths the notch. There are time-domain techniques that have proven to be more effective for smoothing notches such as U.S. Pat. No. 8,194,874 (Blair/Lyon/Starobin). Finally, it should be added that narrow-band notches are generally less objectionable than peaks and, as such, there may be instances when choosing to allow them results in a better user experience.

Note that a distinction between correcting for "room" effects and the inherent acoustic response of the loudspeakers should be made. When room effects are to be addressed, one must account for the loudspeaker's response by extracting it from the combined loudspeaker and room response.

As used within this disclosure, an "environment frequency response" generally refers to an acoustic measurement of one or more room characterization (calibration) signals in the frequency domain derived from the time domain. An FFT (Fast Fourier Transform) function may be performed on the acoustic data (impulse response) captured by one or more microphones, such as a micro-electromechanical systems (MEMS) microphone, to generate the environment frequency response for each of a plurality of locations and orientation positions. While environment frequency response is sometimes referred to as a "room frequency response," for the purpose of this disclosure "environment frequency response" is preferred as it indicates a possibility of use in a partially or fully outdoor environment.

As used within this disclosure, a "position" of a user generally refers to a location within a physical space, for example, in terms of cartesian coordinates.

As used within this disclosure, an "orientation" of a user generally refers to a direction a user-worn headset is facing in terms of a horizontal and/or vertical plane within a physical space.

As used within this disclosure a "signal path" generally indicates a conduit for a wired or wireless signal that is conveyed from a signal transmitter (source) to a signal receiver (destination). For example, a signal path may include a conducting wire for electrical signals, an optical fiber or other waveguide for an optical signal, or a transmission medium for an electromagnetic wave.

Reference will now be made in detail to embodiments of the present invention, examples of which are illustrated in the accompanying drawings. Wherever possible, the same reference numbers are used in the drawings and the description to refer to the same or like parts.

Figure 1B:
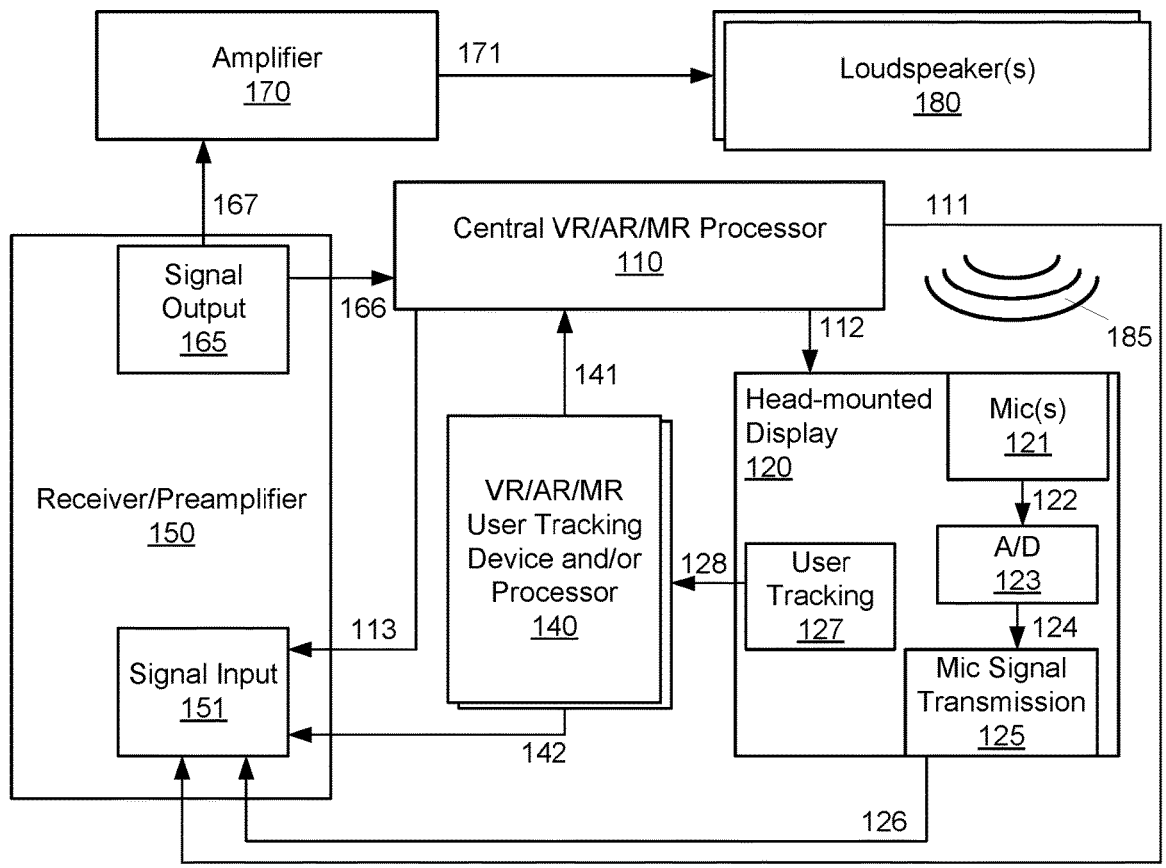
FIG. 1B is a schematic system diagram of the first exemplary embodiment.

As shown in FIG. 1A, exemplary embodiments for the system 100 (FIG. 1B) and method of the present invention include a virtual and/or mixed reality headset device, referred to herein as a head-mounted display 120 worn by a user 106 within an acoustic space 102. The head-mounted display 120 contains one or more microphones 121 (FIG. 1B) affixed to or incorporated within the headset device 120, one loudspeaker or multiple loudspeakers in a multi-channel transducer system 180, and a plurality of processing units 110, 140, 150 (FIG. 1B). The system and method use the microphone(s) 121 (FIG. 1B) to characterize an acoustic space 102 of a user 106 of the head-mounted display 120. Embodiments of the system and method correct an audio signal in order to compensate for errors or changes introduced by the acoustic space 102. The microphone(s) 121 (FIG. 1B) on the head-mounted display 120 are used for an acoustic characterization process at the beginning of an engagement by the user 106 with the headset device 120 where the system 100 characterizes the acoustic space 102 by introducing test signals into the loudspeakers 180 and measuring, for example, an impulse response, a spectral frequency response, and the direction of arrival of the test signals. Once characterized, the system 100 modifies the signal to correct for errors or changes introduced by the acoustic space 102. While the user 106 navigates audiovisual content using the head-mounted display 120, movement and/or orientation of the user 106 within the acoustic space 102 activates a continuous audio correction process.

Figure 1C:
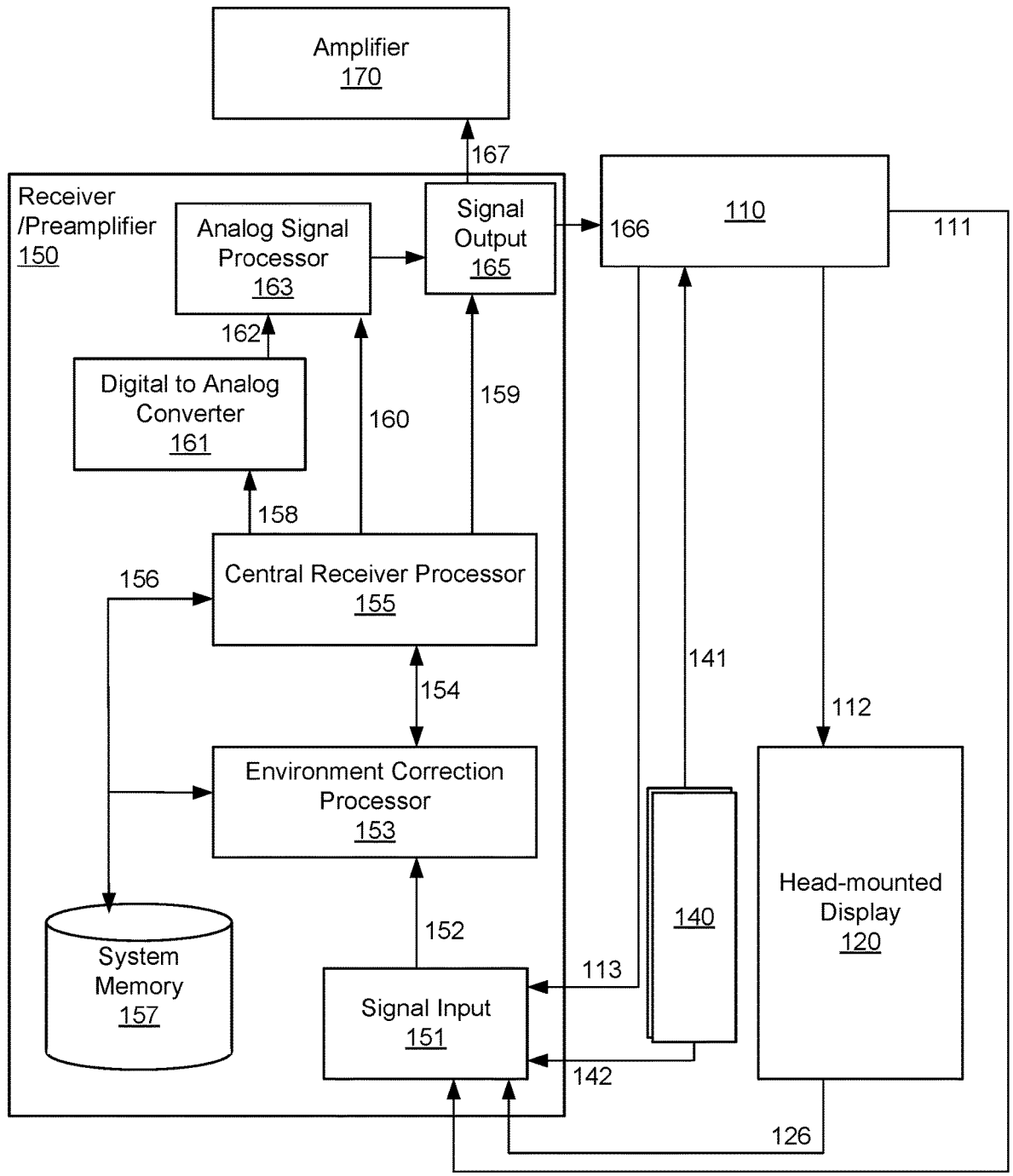
FIG. 1C is a schematic diagram detailing the receiver/preamplifier of FIG. 1B.

Under a first exemplary embodiment 100 shown in FIGS. 1B and 1C, a head-mounted display 120 contains one or more microphones 121 and uses the processed signal(s) from microphone(s) 121 to first characterize the acoustic space 102 and thereafter to modify an audio signal provided to the loudspeakers 180 to correct errors introduced by the acoustic space 102. For purposes of clarity, this disclosure generally refers to "microphone" 121 in the singular unless a distinction needs to be made for scenarios involving more than one microphone (such as a pair of microphones and/or an array of microphones). The system 100 generally initially operates when the user is stationary within the acoustic space 102 and continues to function in real time as the user 106 moves within the acoustic space 102. Different microphone configurations may be employed by the head-mounted display. For example, a first microphone 121 may be located near the center of the head-mounted display 120 (for example, above nose bridge of the user 106), and/or a second and third microphone 121 may be located on a band attached to the head-mounted display 120 above each ear of the user 106. Alternatively, or in addition, a multi-microphone array may be located across a central portion of the headset in non-coincident array or across any area spanning the length, width, and depth of the headset. These microphone(s) 121 provide an analog audio signal that is provided to an analog to digital converter 123 inside the head-mounted display 120 that provides a converted digital signal to a mic signal transmitter 125, for example, a Wi-Fi transducer, a radio frequency chip such as Bluetooth, or a tethered cable. The mic signal transmitter 125 transmits the signal captured by the microphone(s) to a processing unit, for example, a signal input 151 of a receiver/preamplifier 150 that also processes the acoustic content output from a central virtual reality, AR, or mixed reality processor 110 for the loudspeakers 180.

During an initial characterization of the acoustic environment space, the loudspeakers reproduce one or more test signals. The microphone 121 captures an in-environment or in-room impulse response and a spectral measurement of the energy reaching the microphone(s) is analyzed as a frequency response measurement using a Fast Fourier Transform (FFT). These measurements determine a time delay introduced by the acoustic space 102 by comparing the signal sent to each loudspeaker 180 channel and summing of all channels, to determine whether each channel is properly connected and placed correctly in the acoustic space 102. As a result, the system 100 determines how corrective filters, equalization, delay adjustment, and gain adjustment are utilized for an instance triggered by the method.

One or more loudspeakers 180 are connected to an amplifier 170 which receives an input signal 167 from a preamplifier/receiver 150 connected to processor 110 that delivers a digital video signal 112 to the head-mounted display 120. Examples of the processor 110 include, for example but not limited to, a game console, a computer, and a storage media device compatible with the head-mounted display 120. The processor 110 delivers the digital video signal 112 to the head-mounted display 120 and also delivers a digital audio signal 111 to the receiver/preamplifier 150 which decodes the digital audio signal 111 with a central receiver processing unit 155, for example, using a digital signal processor (DSP) integrated circuit. The central receiver processing unit 155 sends the digital audio signal 158 to a digital to analog converter 161 which, in turn sends the analog signal to the amplifier 170 (for example, via an analog signal processor 163 and signal output interface 165) that powers the loudspeakers 180.

The central virtual reality, augmented reality, and/or mixed reality processing unit 110 distributes visual, audio, and haptic signals to the head-mounted display 120, processes user input data from controllers, and processes user tracking data to modify the output signals 111, 112, 113. In the first embodiment, visual and haptic signals are distributed via signal 112 either via a wire or wirelessly. The audio signal 111 is distributed to the receiver/preamplifier 150 for processing through a cable or wirelessly. The central VR, AR, and/or MR processing unit 110 receives a user tracking data signal via a first digital user tracking data signal 141 through a wire or wirelessly from a user tracking device and/or processing module 140. The central VR, AR, and/or MR processing unit 110 sends digital control signals 113 to the receiver signal input interface 151 for menu navigation for selecting receiver settings and/or commands such as initiating the calibration pre-mapping process.

The head-mounted display (HMD) unit 120 may be attached to several sub-processors 121, 123, 125, 127 and/or may be in communication with processors 110, 140 via signals 112, 128. The microphone 121 is located on the head-mounted display 120 and captures acoustic vibrations 185 from the acoustic space 102. The resulting analog audio signal 122 is provided to an analog to digital converter 123. The analog to digital converter 123 converts the analog audio signal 122 received from the microphone 121 into a digital signal 124 that is sent to a signal transmission module 125. The signal transmission module 125 may include, for example, a Bluetooth chip, a WiFi chip, or a cable output node that sends a digitized microphone signal 126 to the receiver/preamplifier 150.

A user tracking module 127 interacts with one or more user tracking devices 140 such as cameras or light-based sensors depending on the make and model of the VR, AR, and/or MR HMD 120. The user tracking module 127 provides a wired or wireless digital signal 128 to these user tracking devices 140 to determine the orientation and position (via positional coordinates (x, y, z)) of the user 106 relative to the acoustic space 102.

The user tracking devices and/or processors 140 may or may not be located within the HMD 120 itself. For example, some HMDs incorporate cameras to visually map the acoustic space, to determine the orientation of the user 106, and to determine the positional (x, y, z) coordinates of the user relative to their environment. Many HMD models utilize external cameras or external light-based sensors that are placed throughout the acoustic space before the VR, AR, and/or MR system is initialized. The user tracking devices and/or processors 140 provide the user orientation and position relative to the acoustic space 102 both to the central VR, AR, and/or MR processing unit 110 and to the receiver 150. The user tracking devices and/or processors 140 may send user tracking data to the central VR, AR, and/or MR processing unit 110 via the first digital user tracking data signal 141 and to the receiver 150 via a second digital user tracking data signal 142. In alternative embodiments the central VR, AR, and/or MR processing unit 110 may incorporate one or more user tracking devices/processor 140 in which case the user tracking data signal 128 from the HMD 120 may be sent to the receiver 150 by whichever processing unit(s) processes such data.

The receiver/preamplifier 150 includes a plurality of processors 151, 153, 155, 161, 163 and system memory 157. The receiver/preamplifier 150 is in communication with the central VR/AR/MR processor 110, the HMD 120, user tracking devices and/or processors 140, and the amplifier 170 via digital audio signal 111, digitized microphone signal 126, digital user tracking data signal 142, and command signal 160. In an alternative embodiment the receiver/preamplifier 150 may be incorporated within another audio component, for example, a soundbar or active speaker.

The signal input interface 151 may receive wired and wireless signal, for example but not limited to cable node inputs, a connection to Wi-Fi signals, and a connection to Bluetooth signals. The signal input interface 151 provides digital signal distribution paths for signals received by the signal input interface 151 to an environment correction processor 153.

The environment correction processor 153 characterizes the environment of the user (acoustic space 102) as the user 106 moves throughout the environment 102. The environment correction processor 153 compares the data captured by the microphone 121 with a target frequency response curve stored in system memory 157 and maps the environment 102 using the user tracking data from user tracking devices and/or processors 140. This characterization results in modifications to the signal that change as the user 106 moves throughout her VR/AR/MR experience. These modifications are stored in system memory 157. The modified audio signal 154 is sent to the central receiver processor 155 for distribution to the associated output channels. In alternative embodiments, the environment correction processor 153 may be incorporated within the central receiver processing unit 155. The central receiver processor 155 controls parameters such as system volume and distributes the audio signal amongst respective channels (via digital audio signals 158) to the digital to analog converter 161.

The environment correction processor 153 sends a (modified or unmodified) digital signal 154 to the central receiver processor 155. The central receiver processor 155 may send signal distribution parameter data or update data to the environment correction processor 153. A digital bus 156 provides communication among the system memory 157, the environment correction processor 153, and the central receiver processor 155.

The digital audio signal 158 conveys audio signal(s) to be converted into analog signal(s) by the digital to analog converter 161 and sent out for further processing to the analog signal processor 163, further to a signal output interface 165, and then to the amplifier 170 for amplification.

The signal output interface 165 receives a menu and settings selection digital signal 159 from the central receiver processor 155 which is conveyed to 110 via a signal 166. The central receiver processor 155 sends a digital and/or analog signal 160 that may command the analog signal processor 153 to process the analog signal(s) 162 with filter, delay, phase, and gain parameters.

The digital to analog converter 161 receives digital audio signal(s) 158 and converts them into analog signal(s) 162 to be sent out for processing to the analog signal processor 163 or to pass through to the signal output interface 165.

One or more analog signals 162 are sent from the digital to analog converter 161 to the analog signal processor 163 for processing (or pass-through) as directed via a command signal 160 from the central receiver processor 155 and/or the environment correction processor 153.

The analog signal processor 163 receives the analog signal 162 from the digital to analog converter 161 and may apply filter, delay, phase, and gain parameters at the direction of the central receiver processor 155/4c instead of the central receiver processor 155/4c applying parameters to the audio signal(s) in a digital form or for additional processing. The analog signal processor conveys an output signal 164 to the signal output interface 165.

The signal output module 165 sends processed audio signal(s) 167 to the amplifier 170 confirms selection settings commands back to the central VR, AR, and/or MR processing unit 110 via digital signal 166.

The amplifier 170 takes the respective audio analog signal channel data and amplifies it to the respective loudspeaker(s) 180. The amplifier provides a plurality of amplified analog audio signal data 171 for each respective loudspeaker channel of the loudspeakers 180. In alternative embodiments, the amplifier 170 may be integrated with the receiver 150.

The loudspeaker(s) 180 are electro-mechanical-acoustic devices (transducers) that convert the analog audio signal(s) into sound waves 185 projected into the environment 102. The sound waves 185 produced by the loudspeaker(s) 180 may be affected by the environment 102, for example, by absorption, reflection, diffusion, diffraction, among others, and received by the microphone 121.

Before utilizing media content on the headset device, the user is prompted to remain stationary at a substantially centered distance from the loudspeakers 180 so an initial characterization of this system 100 can be performed. The receiver/preamplifier 150 and/or amplifier 170 sends a characterization stimulus sequentially to each loudspeaker 180. These test stimuli cover the same range of frequencies, for example 20 Hz to 20 kHz. An example of one such characterization signal is a sine wave sweep that repeats for four cycles at each loudspeaker 180 in the system 100. The energy from each test signal is captured by the microphone 121 on the headset device 120 and transmitted wirelessly or through a wire to the preamplifier/receiver 150 for characterization and processing. This characterization includes a comparison of the intended frequency response of each loudspeaker 180 with the frequency response (achieved, for example, via applying an FFT to the time domain impulse response) captured by the microphone 121. If there is more than one microphone 121 on the headset the characterization may also include a direction of arrival measurement to locate the sources from where the energy in the physical environment originates relative to the HMD (120). After this characterization, appropriate corrective filters, equalization, delay adjustments, and gain adjustments are applied.

During this process, the user may be prompted to move about the environment within the range of likely locations that shall be occupied during the VR/AR/MR session. In general, more orientations and locations provide a better mapping. Once the system has been so characterized to an environment, the process may need to be repeated when substantial changes to the environment are made, for example, a large couch is added to a room that previously only had a chair. The HMD location for calibration and subsequent system sessions may be based on an origin point set by geometry defined by the VR, AR, MR system.

After this initial characterization, the user may utilize the headset for the selected VR content. As the user 106 navigates the audiovisual space the headset 120 and loudspeaker system 180 are simulating, the processor 110 that sends a visual signal 112 to the headset and an audio signal 111 to the preamplifier 150 is being sent user tracking data 141 that can include the tracking of the head, hands, and body of the user 106. This tracking data 141 is used by the processor 110 to alter its visual and audio signals to simulate the user interacting in a world where other virtual objects move in virtual space. The alteration to the audio signal may include an adaptive filter that modifies a head-related transfer function (HRTF). As the user 106 moves around the physical environment 102 in which the loudspeaker system resides, the user may experience modifications to the sound caused by the physical environment that distort the acoustic signal from the loudspeakers 180 in ways an adaptive filter such as one for an HRTF and/or the initial room calibration process could not predict.

For example, as a user turns and moves toward a wall, reflected acoustic energy, indirectly radiated sound from loudspeakers 180 may increasingly distort the audio aspects of the simulation. These distortions may be corrected for in the embodiments through a digital trigger that may be activated by, for example, a certain parameter of user tracking data, a timer, a camera, or a light-based sensor. Once activated, the processor 110 sending virtual and/or mixed reality signals 112 to the headset 120, and/or the preamplifier/receiver 150, causes the microphone(s) 121 on the headset 120 to begin capturing the acoustic energy in the environment 102, for example, to take spectral frequency response measurements, impulse response measurements, and/or direction of arrival measurements. Several acoustic measurements may be taken and continuously averaged. These frequency and impulse response measurements are characterized in comparison to the intended signal by the processors 153, 155 in the preamplifier/receiver 150. Once characterized, the corrective filters, delay adjustments, and gain adjustments are applied.

Figure 2:
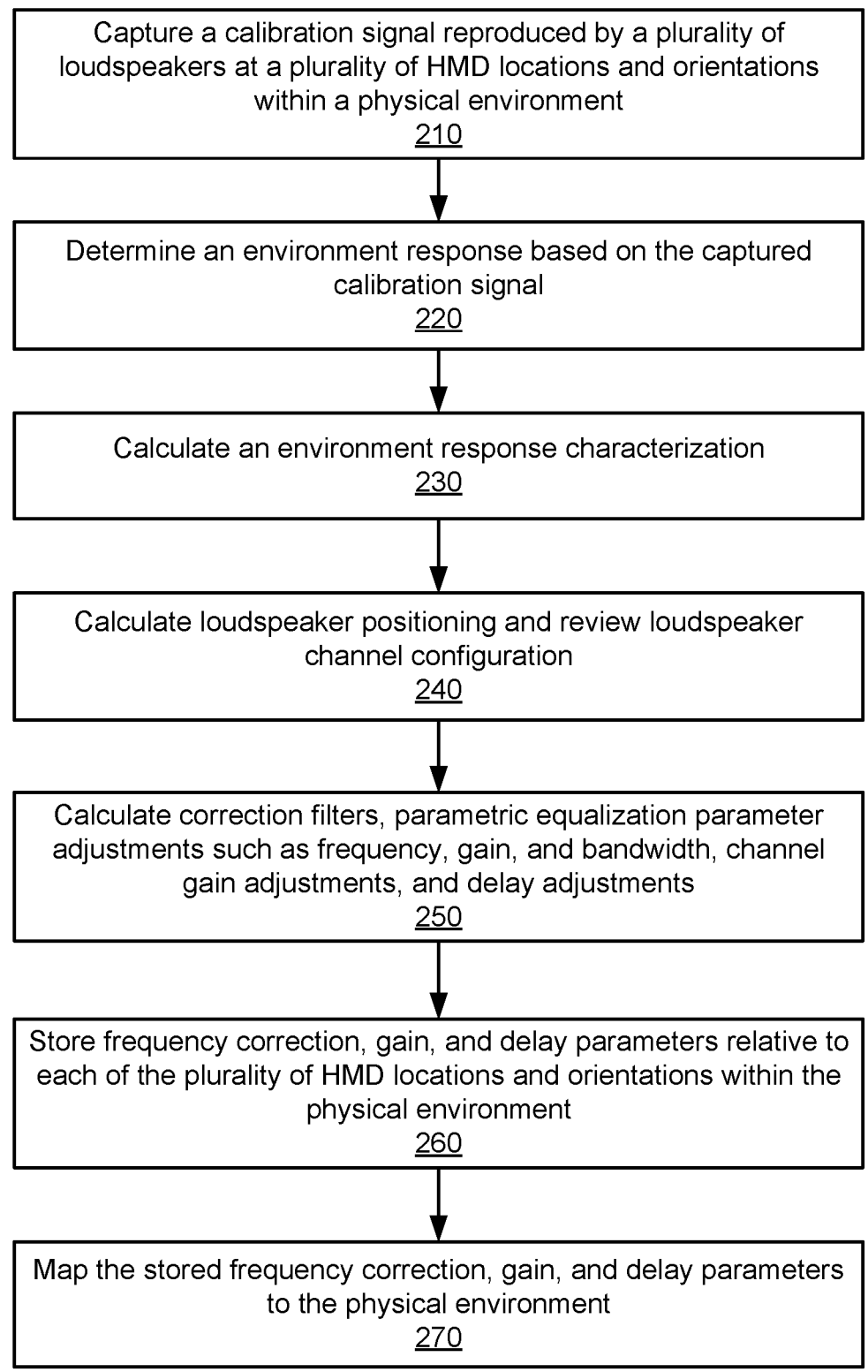
FIG. 2 is a flowchart of an exemplary first embodiment of a method for mapping an acoustic environment for a VR/AR/MR system.

FIG. 2 is a flowchart of an exemplary first embodiment of a method for mapping an acoustic environment for a VR/AR/MR system. It should be noted that any process descriptions or blocks in flowcharts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention. The description of this method refers to FIGS. 1A-1C.

Parameters of the signal processing sub-system are initialized, for example, powering on the receiver 150, head-mounted display 120, controllers 110, 140, and other devices that utilize power in the system. A calibration of the system 100 is initialized, for example, upon receipt of a user prompt. For example, a menu and instructions, viewable and selectable with the HMD 120 and its respective controllers and/or a control device for the receiver 150 such as a remote, instruct the user how to proceed with the calibration pre-mapping of the user environment.

The microphone 112 captures a calibration signal reproduced by the plurality of loudspeakers 180 at a plurality of HMD locations and orientations of the HMD 120 within the physical environment 102, as shown by block 210. Calibration signal(s) (for example, but not limited to one or more of pink noise, white noise, EIA noise, maximum length sequence, and/or other types of broadband spectrum noise between 10 Hz-20 kHz, and/or a sine wave sweep anywhere between 10 Hz-20 kHZ) are sent to every audio channel of each loudspeaker 180 in the system 100. The user 106 may be prompted to move and orient herself to multiple positions throughout the environment 102. For each position/orientation, at least one calibration signal is sent to each loudspeaker channel. The microphone 121 captures the calibration signal(s) as they are transmitted from each loudspeaker channel for each position/orientation. For embodiments with multiple microphones 121, each microphone may have its own input capture channel which may be treated as individual signals or multiplexed into one signal. The position of the user (for example, x, y, z coordinates) and orientation may be stored along with each captured acoustic data measurement.

An environment response is determined based on the captured calibration signal, as shown by block 220. The system 100 calculates the signal to noise ratio by measuring the noise floor before each broadband spectrum signal measurement to ensure the calibration signal is at least 10 dB SPL above the noise floor, which may include, for example, measuring the ambient noise and adjusting the gain of each channel in the system to achieve this calibration signal level dynamic. The system 100 may also utilize a Noise Rating curve, such as NR 50 or lower, a Noise Criteria curve, such as NC 50 or lower, a Room Criteria curve, such as RC 50 or lower, a Balanced Noise Criteria curve, such as NCB 60 or lower, or a similar curve recommended by ANSI S12.2: American National Standard Criteria for Evaluating Room Noise to ensure characterization is validated by an industry standard for ambient noise level evaluation. An environment frequency response is generated for each speaker channel at each user location and orientation. This response may be a measurement of one or more of the calibration signals. A Fast Fourier Transform (FFT) function may be performed on the acoustic data captured by the microphone 121 to generate this response for each user location and orientation position. An environment response characterization is calculated, as shown by block 230.

The FFTs (see block 220) are compared with a predetermined target response curve in the frequency domain stored in system memory 154. The difference between the measurement of each channel at the microphone 121 and the target response curve itself may be considered an environmental distortion in the frequency domain. Each channel may be individually characterized to ensure each channel meets a specified target response curve in the and frequency domain. The sum of all channels may also be used for characterization by taking the difference between this sum and a target response curve to determine an effect of the environmental distortions in the frequency domain.

A positioning of the plurality of loudspeakers 180 is calculated and a loudspeaker channel configuration is reviewed, as shown by block 240. If the microphone 121 includes a microphone array, a direction of arrival measurement can be derived from the acoustic data captured by the array to confirm the correct speaker channel is being calibrated. If the direction of arrival measurement determines the user 106 is not orientated correctly or in the correct position, the error is conveyed to the user 106 with instruction on which loudspeaker 180 should be transmitting the calibration signal. The direction of arrival measurement to isolate the correct channel along with the difference between each channel's calibration signals arrival in the time domain is used to determine the amount of signal delay for each channel such that each transmitted channel arrives at the user position/orientation at the same time. Isolation of the correct channel via a direction of arrival measurement is generally not needed.

At least one parametric equalization parameter such as a correction filter, a parametric equalization parameter adjustment, a channel gain adjustment, and/or a summed gain adjustment is calculated and stored, as shown by block 250. The difference between the target response curve and the FFT procured for each location is used to determine the parametric equalization parameters needed to match each channel output and/or the sum of all channels as close to the respective target curve as possible. As mentioned previously, an alternative time-domain means of achieving room correction is detailed in U.S. Pat. No. 8,194,874 (Blair/Lyon/Starobin) which is incorporated by reference in this disclosure in its entirety.

A value of at least one of a filter parameter, parametric equalization parameter such as a gain parameter, a bandwidth parameter, and/or a frequency parameter, and/or a delay parameter relative to each of the plurality of HMD locations and orientations within the physical environment is stored, as shown by block 260. Every processed filter parameter, parametric equalization parameter, gain parameter, and delay parameter for each position and orientation is saved in the system memory 157 to be activated as the user 106 reenters the position and orientation during her VR/AR/MR experience. A greater number of positions and orientations collected during calibration, yields greater accuracy of the system 100 to correct for environmental distortions throughout the experience of the user 106. A linear or non-linear interpolation may be utilized to estimate what parameters need to be shifted as the user moves between saved positions and orientations. For example, linear interpolation may be used where a user moves along or orthogonal to a positional axis used during calibration, while a non-linear interpolation may be needed, for example, for off-axis user movements. Preferably, the actions described by blocks 210 through 260 may be iterated to ensure the user environment is thoroughly covered in calibration measurements, for example, according to a user settings control.

At least one of the stored values of the filter parameters, the parametric equalization parameters, the gain parameter, and/or the delay parameters is mapped relative to each of the plurality of HMD locations and orientations within the physical environment, as shown by block 270. Preferably, as many possible parameters that may be changed at as many possible locations and orientations are stored throughout the user environment for use during the VR/AR/MR experience of the user.

Figure 3:
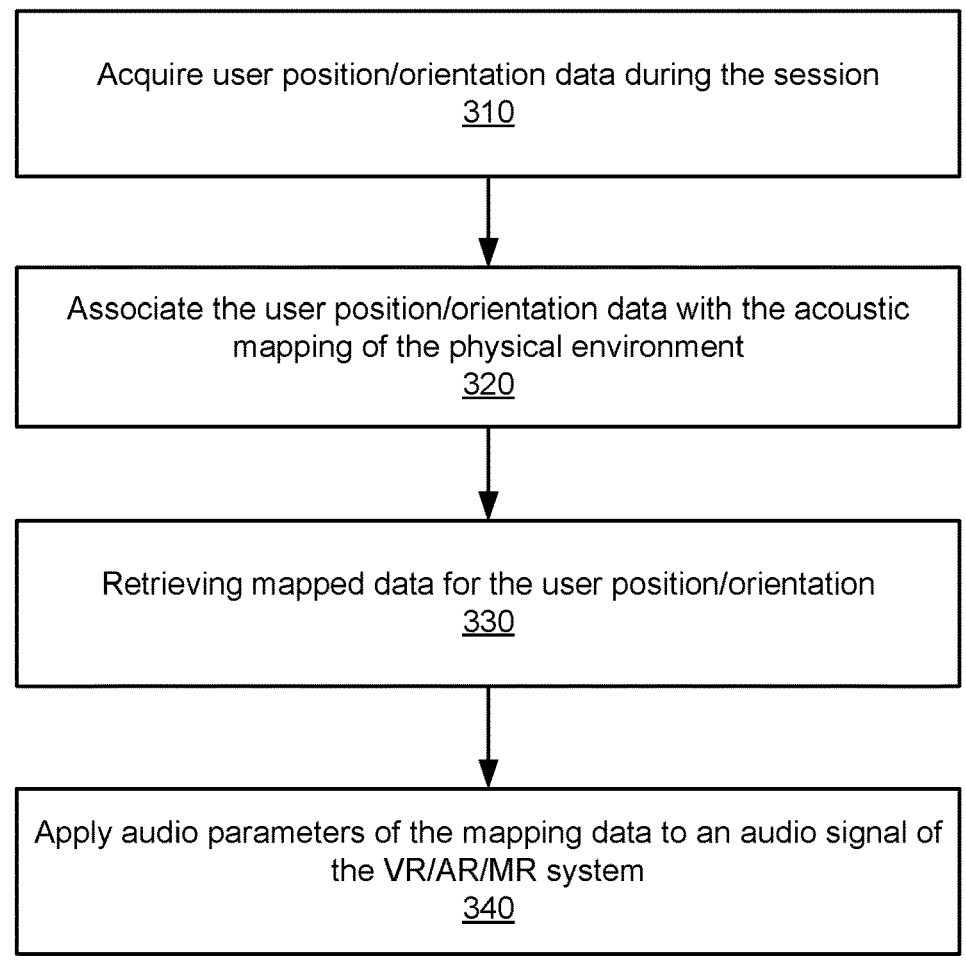
FIG. 3 is a flowchart of an exemplary method embodiment for applying an acoustic mapping according to movements of a user within a physical environment during a VR/AR/MR session.

FIG. 3 is a flowchart of an exemplary method embodiment for applying an acoustic mapping according to movements of a user within a physical environment during a VR/AR/MR session. The user begins to utilize the VR/AR/MR system to experience the content they have selected.

A data is acquired by the environment correction processing system regarding the position/orientation data of the user during the session, as shown by block 310, as the user moves within the physical environment. For example, the orientation/position data may be collected periodically during the session, or may be collected based upon a system event, for example, a motion sensor of the headset, among others.

The user position/orientation data is associated with the mapping data for one of the plurality of HMD locations and orientations within the physical environment, as shown by block 320. This orientation and positioning data is matched to the same orientation and position data from the saved calibration pre-mapping and the processing parameters are retrieved from the system's memory, as shown by block 330. One or more audio parameters of the retrieved mapping data is applied to an audio signal of the VR/AR/MR session according to the user position/orientation, as shown by block 340. Blocks 310-340 may repeat continuously as the user moves throughout the physical environment, so the system can continuously adjust the audio signal to compensate for acoustic properties in the physical environment.

A second embodiment provides an alternative means of mitigating acoustic room artifacts, employing acoustically transparent headphones through which correction signals, derived in real-time, are played. In this embodiment, there may be no need to actively process the multichannel audio signals reproduced by the loudspeaker system. Instead, derived correction signals may be played through the headphones, for example, headphones integrated into the HMD. These correction signals sum at the ears of the user such that the perceived audio component of the multi-media virtual reality experience matches pre-established (or known, a priori) target response curves for the dynamically changing user location within the acoustic space. While "open back" headphones may be regarded as substantially transparent (low acoustic insertion loss), significant effects may be expected on high frequency sound transmission in their presence. An associated pre-determined fixed inverse transfer function may be applied to the dynamic room-correction signals so as to compensate for their presence.

Figure 4:
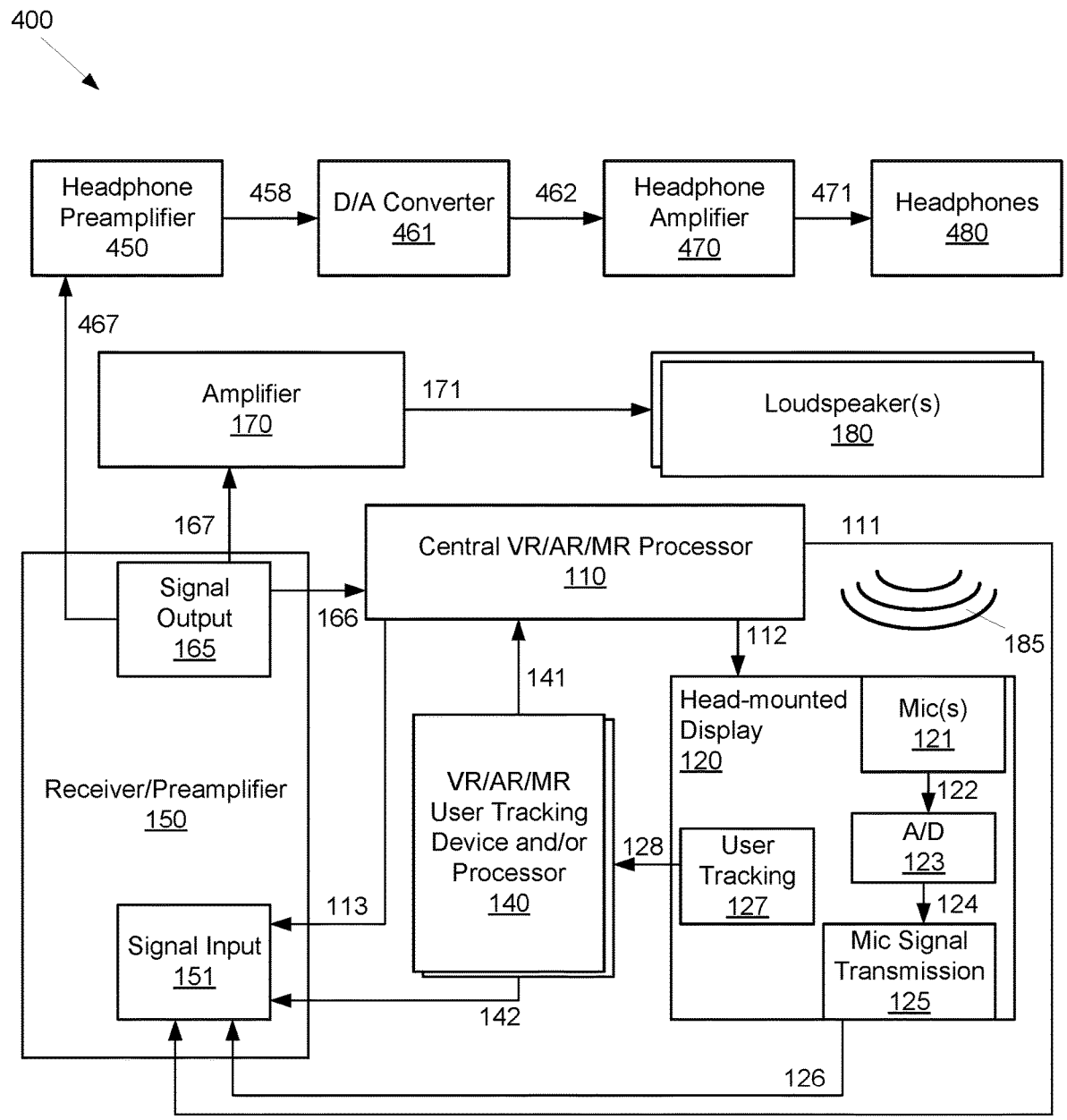
FIG. 4 is a schematic diagram of a second exemplary system embodiment.

The second system embodiment, by virtue of a wearable microphone array coupled with acoustically transparent headphones, provides an improved listening experience regardless of the listener's location within the acoustic space relative to the loudspeakers and room boundaries. By constantly monitoring the wearer's location, corrective signals are generated which combine with the loudspeaker's output to improve acoustic performance FIG. 4 is a schematic diagram of a second exemplary system embodiment 400. The second embodiment 400 is essentially similar to the first embodiment with additional elements. Under the second embodiment, the user may be wearing acoustically transparent headphones 480, for example, open backed headphones, such that the user 106 is able to hear audio content 471 reproduced by the headphones 480, as well as audio content 185 produced by the loudspeakers 180. For example, under the second embodiment, the loudspeakers 180 may be configured to produce only certain frequency bands, such as low frequencies produced by a subwoofer, and the headphones 480 produce complementary frequencies, for example, low-midrange through high frequency content.

Under the second embodiment, the central receiver processor 155 (FIG. 1C) includes left and right headphone channels in the digital signal 159 (FIG. 1C) provided to the signal output interface 165. A headphone preamplifier 450 receives headphone digital audio channel signals 467 from the signal output interface 165. The headphone preamplifier 450 receives headphone digital audio channel signals 467 and distributes them to a digital to analog converter 461 via signal path 458. A digital to analog converter 461 converts the headphone digital audio channel signals 467 into analog signal(s) sent to a headphone amplifier 470 via an analog signal path 462. The headphone amplifier 470 amplifies received analog signals(s) 471 directly to the headphones 480. The headphones 480 may be, for example, acoustically transparent, semi-transparent, or other headphones transmitting the processed audio signal(s) to the user.

Figure 6:
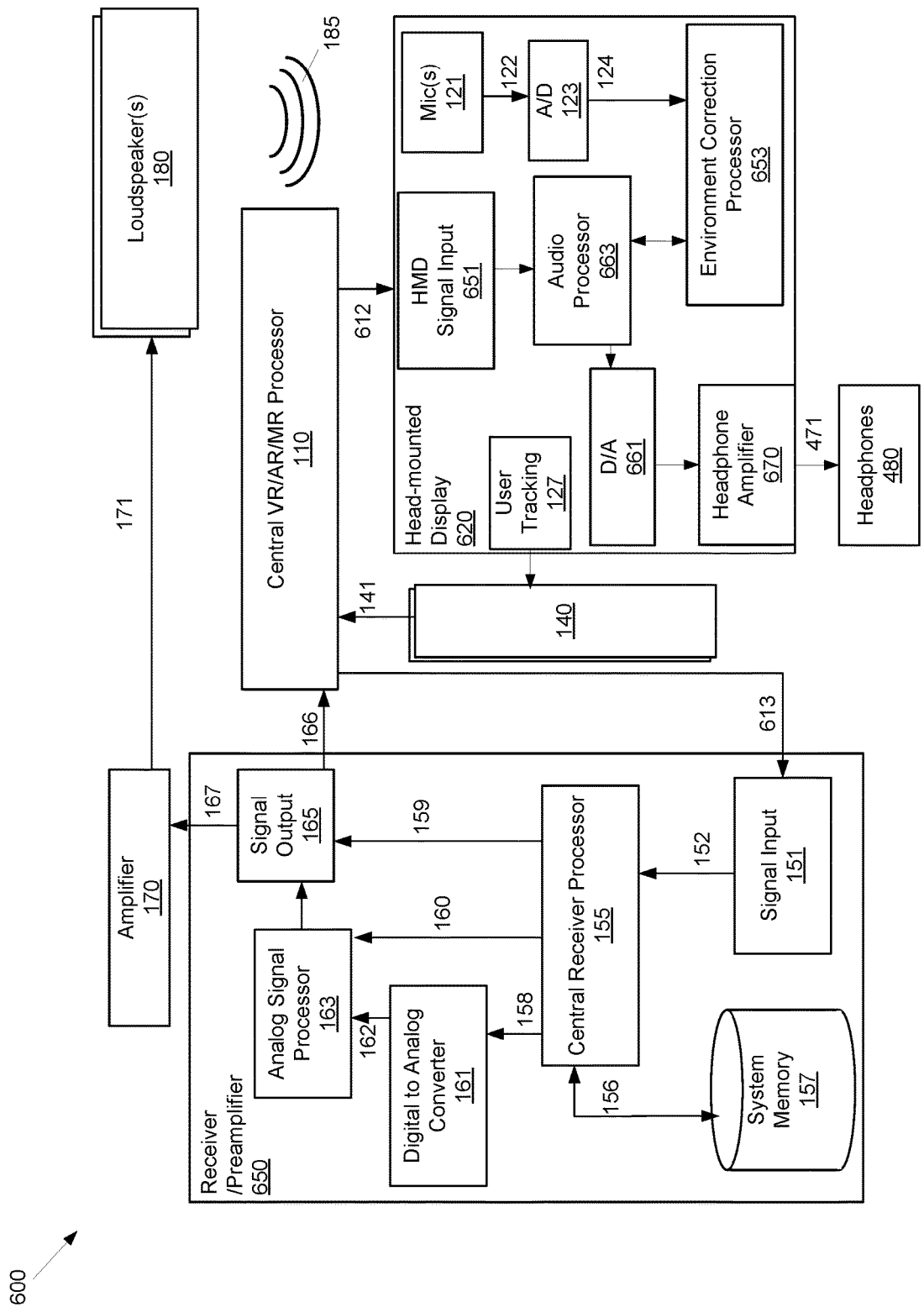
FIG. 6 is a schematic diagram of a third exemplary system embodiment.

FIG. 6 is a schematic diagram of a third exemplary system embodiment 600. The third embodiment 600 provides a similar functionality to the second embodiment, with variations of processor functionality, processor locations, and signal paths. Elements with the same element numbers are described above with regard to the first embodiment.

Under the third embodiment, a head mounted display 620 receives an input signal 612 from a central VR/AR/MR processor 110, where the central VR/AR/MR processor 110 may be substantially similar to the first and second embodiments. The input signal 612 may be a digital audio signal being sent from central VR/AR/MR processor 110 via a cable or wirelessly to the signal input interface 620, and carry digital, visual, and haptic signals from central VR/AR/MR processor 110 via a cable or wirelessly to a head-mounted display unit 620. An HMD signal input interface 651 conveys the received input signal 612 to an audio processor 663.

The audio processor 663 provides signal distribution to further processing and redistribution of the received signal towards a signal path for headphones 480, for example, acoustically transparent headphones. The headphone signal path includes a digital-to-analog converter 661 and a headphone amplifier 670.

The environment correction processor 653 characterizes the physical environment based on acoustic data captured by the microphone 121 and receives the audio signal from the audio processer 663 to apply correction parameters to the signal and then return this processed signal to the audio processor 663 to be sent to a digital to analog converter 661 to being amplified by the headphone amplifier 670 for output to the headphones 480. In alternative embodiments, the functions of the environmental correction processor 653 may be outsourced to an external server (not shown), for example, to be accessed via an internet connection.

Under the third embodiment 600, the receiver/preamplifier 650 is substantially similar to the receiver/preamplifier 150 of the first embodiment, except under the third embodiment, the environment correction processor is part of the HMD 620 instead of being part of the receiver amplifier 650. Another difference from the first embodiment is the signal input interface 151 may only receive an input signal 613 from the central VR/AR/MR processor 110, and not receive inputs from the user tracking devices and/or processors 140.

The third embodiment 600 may be advantageous over the first embodiment for a user with a desire to travel between different locations with different sound systems. For example, the third embodiment may be agnostic to an external loudspeaker system while still providing environment correction, for example in a scenario when the user experiences the addition of a subwoofer and/or the spatial effects of a multi-channel system such as height channels.

The third embodiment 600 may include scenario-specific implementations, for example, on-chip circuitry for the head-mounted display, specific headphones for use with a head-mounted display, correction processing only applied to headphones, and cloud-based digital signal processing, among other variations. Under the third embodiment, correction processing may be applied only to the headphones, only to the external loudspeaker system, or to a combination of the headphones and the external loudspeakers.

Figure 5:
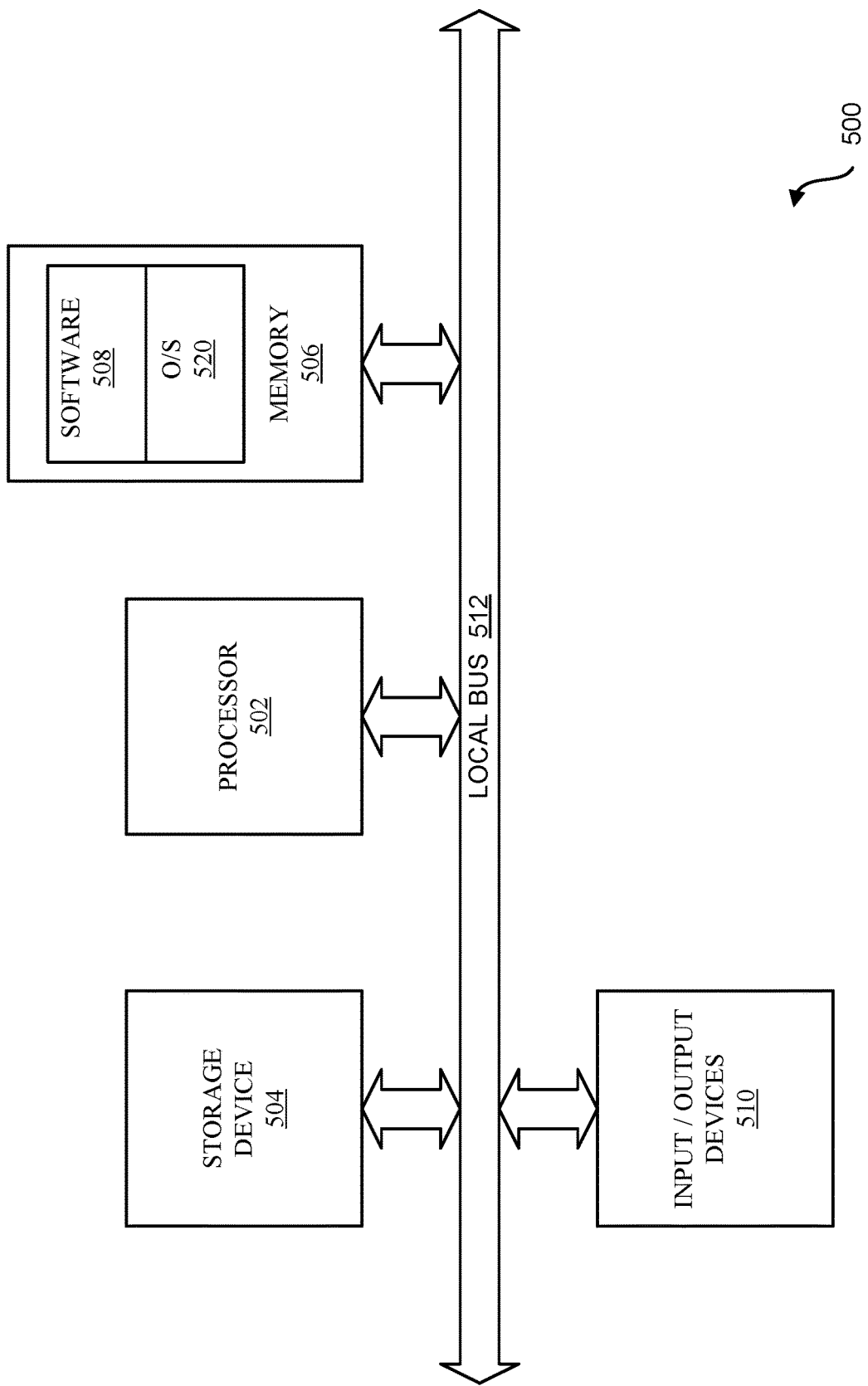
FIG. 5 is a schematic diagram illustrating an example of a system for executing functionality of the present invention.

The present system for executing the functionality described in detail above may be a computer, an example of which is shown in the schematic diagram of FIG. 5. The system 500 contains a processor 502, a storage device 504, a memory 506 having software 508 stored therein that defines the abovementioned functionality, input/output (I/O) devices 510 (or peripherals), and a local bus, or local interface 512 allowing for communication within the system 500. The local interface 512 can be, for example but not limited to, one or more buses or other wired or wireless connections, as is known in the art. The local interface 512 may have additional elements, which are omitted for simplicity, such as controllers, buffers (caches), drivers, repeaters, and receivers, to enable communications. Further, the local interface 512 may include address, control, and/or data connections to enable appropriate communications among the aforementioned components.

The processor 502 is a hardware device for executing software, particularly that stored in the memory 506. The processor 502 can be any custom made or commercially available single core or multi-core processor, a central processing unit (CPU), an auxiliary processor among several processors associated with the present system 500, a semiconductor based microprocessor (in the form of a microchip or chip set), a macroprocessor, or generally any device for executing software instructions.

The memory 506 can include any one or combination of volatile memory elements (e.g., random access memory (RAM, such as DRAM, SRAM, SDRAM, etc.)) and non-volatile memory elements (e.g., ROM, hard drive, tape, CDROM, etc.). Moreover, the memory 506 may incorporate electronic, magnetic, optical, and/or other types of storage media. Note that the memory 506 can have a distributed architecture, where various components are situated remotely from one another, but can be accessed by the processor 502.

The software 508 defines functionality performed by the system 500, in accordance with the present invention. The software 508 in the memory 506 may include one or more separate programs, each of which contains an ordered listing of executable instructions for implementing logical functions of the system 500, as described below. The memory 506 may contain an operating system (O/S) 520. The operating system essentially controls the execution of programs within the system 500 and provides scheduling, input-output control, file and data management, memory management, and communication control and related services.

The I/O devices 510 may include input devices, for example but not limited to, a keyboard, mouse, scanner, microphone, etc. Furthermore, the I/O devices 510 may also include output devices, for example but not limited to, a printer, display, etc. Finally, the I/O devices 510 may further include devices that communicate via both inputs and outputs, for instance but not limited to, a modulator/demodulator (modem; for accessing another device, system, or network), a radio frequency (RF) or other transceiver, a telephonic interface, a bridge, a router, or other device.

When the system 500 is in operation, the processor 502 is configured to execute the software 508 stored within the memory 506, to communicate data to and from the memory 506, and to generally control operations of the system 500 pursuant to the software 508, as explained above.

When the functionality of the system 500 is in operation, the processor 502 is configured to execute the software 508 stored within the memory 506, to communicate data to and from the memory 506, and to generally control operations of the system 500 pursuant to the software 508. The operating system 520 is read by the processor 502, perhaps buffered within the processor 502, and then executed.

When the system 500 is implemented in software 508, it should be noted that instructions for implementing the system 500 can be stored on any computer-readable medium for use by or in connection with any computer-related device, system, or method. Such a computer-readable medium may, in some embodiments, correspond to either or both the memory 506 or the storage device 504. In the context of this document, a computer-readable medium is an electronic, magnetic, optical, or other physical device or means that can contain or store a computer program for use by or in connection with a computer-related device, system, or method. Instructions for implementing the system can be embodied in any computer-readable medium for use by or in connection with the processor or other such instruction execution system, apparatus, or device. Although the processor 502 has been mentioned by way of example, such instruction execution system, apparatus, or device may, in some embodiments, be any computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the processor or other such instruction execution system, apparatus, or device.

Such a computer-readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted, or otherwise processed in a suitable manner if necessary, and then stored in a computer memory.

In an alternative embodiment, where the system 500 is implemented in hardware, the system 500 can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Microphones and microphone arrays are often used in products for the purpose of recording sounds in the environment of a user such as speech or for acoustically characterizing the environment of the user. Audio capabilities of the embodiments of HMD devices disclosed herein to perform these tasks for users and producers may be improved by incorporating microphones and microphone arrays into the HMD unit itself and connect the HMD to an internal or external audio processor capable of processing the measurements that are being captured by the HMD and transmitting the signal to a different processing unit if necessary. A multi-microphone array captures acoustic data that may be processed for calculations such as a direction of arrival measurement to determine a location of a sound source in the environment of the HMD user.

Figure 7A:
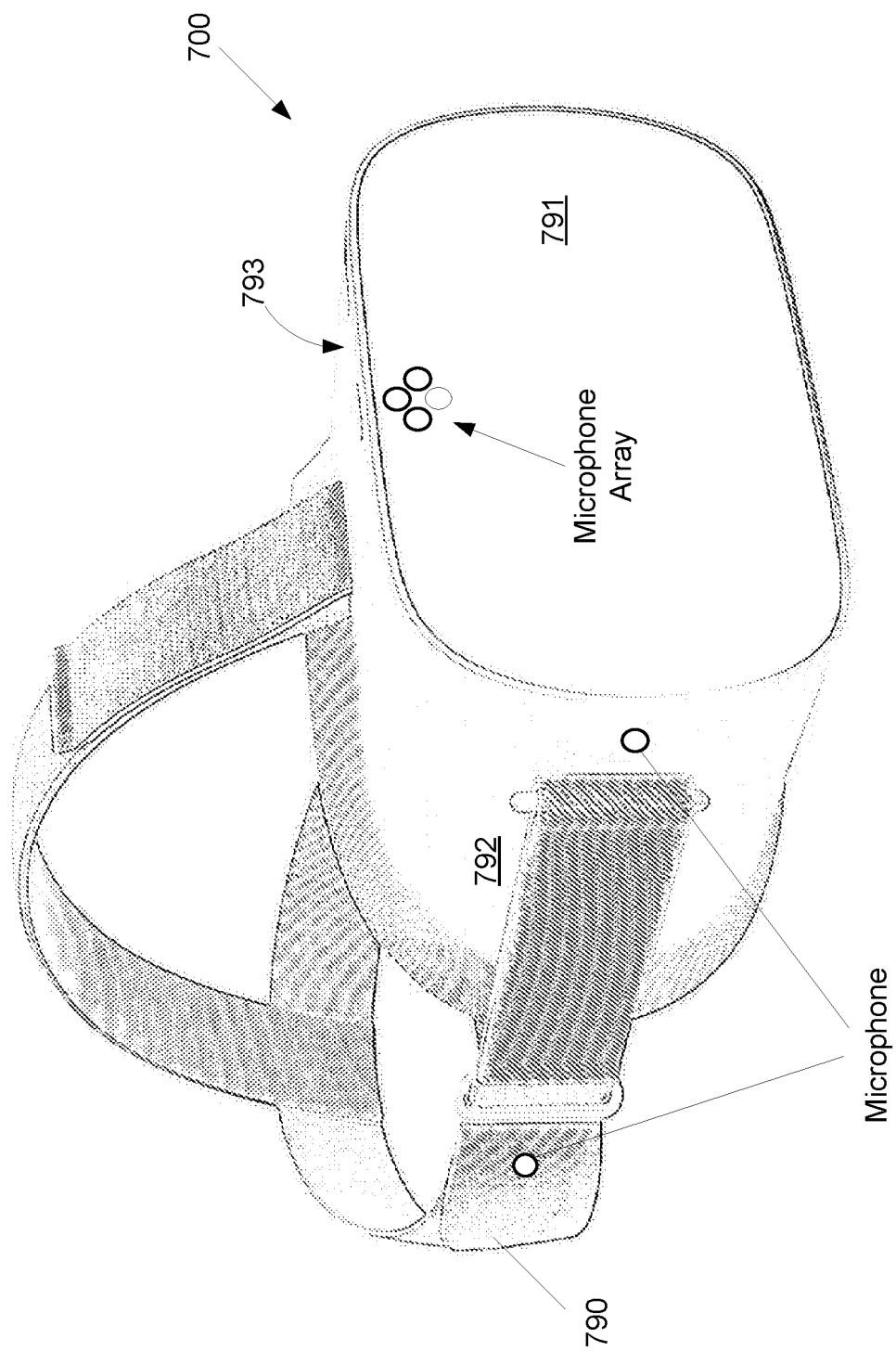
FIG. 7A is a schematic diagram showing an exemplary embodiment of a head-mounted display (HMD) device.

FIG. 7A is a schematic diagram showing an exemplary embodiment of an HMD device 700. The HMD 700 includes a plurality of microphones 721 (FIGS. 7B, 7C), which may be arranged singly, in pairs, and groups/arrays. The microphone and/or microphone arrays 721 may preferably be mounted, for example, on mounting braces 790 near the ears of the user, on a front face 791 of the HMD 700, on display side sections 792, on a display top section 793 of the HMD 700, and combinations of multiple microphones and/or microphone arrays positioned around the HMD 700. A single microphone with channel processing may typically be used calculate the distance to a loudspeaker and record a single channel of acoustic data. Two microphones with channel processing may be able to estimate an angle in half plane, distance to a loudspeaker, and sound velocity from a sound source in one direction. Three microphones with channel processing may be able to estimate an angle of a full plane, distance to a loudspeaker, and sound velocity from a sound source in three-dimensional space. Four or more microphones that are positioned around a three-dimensional spherical shape with processing may be able to estimate the distance to a loudspeaker, all angles in three-dimensional space, and the sound velocity in three dimensional space.

Figure 7B:
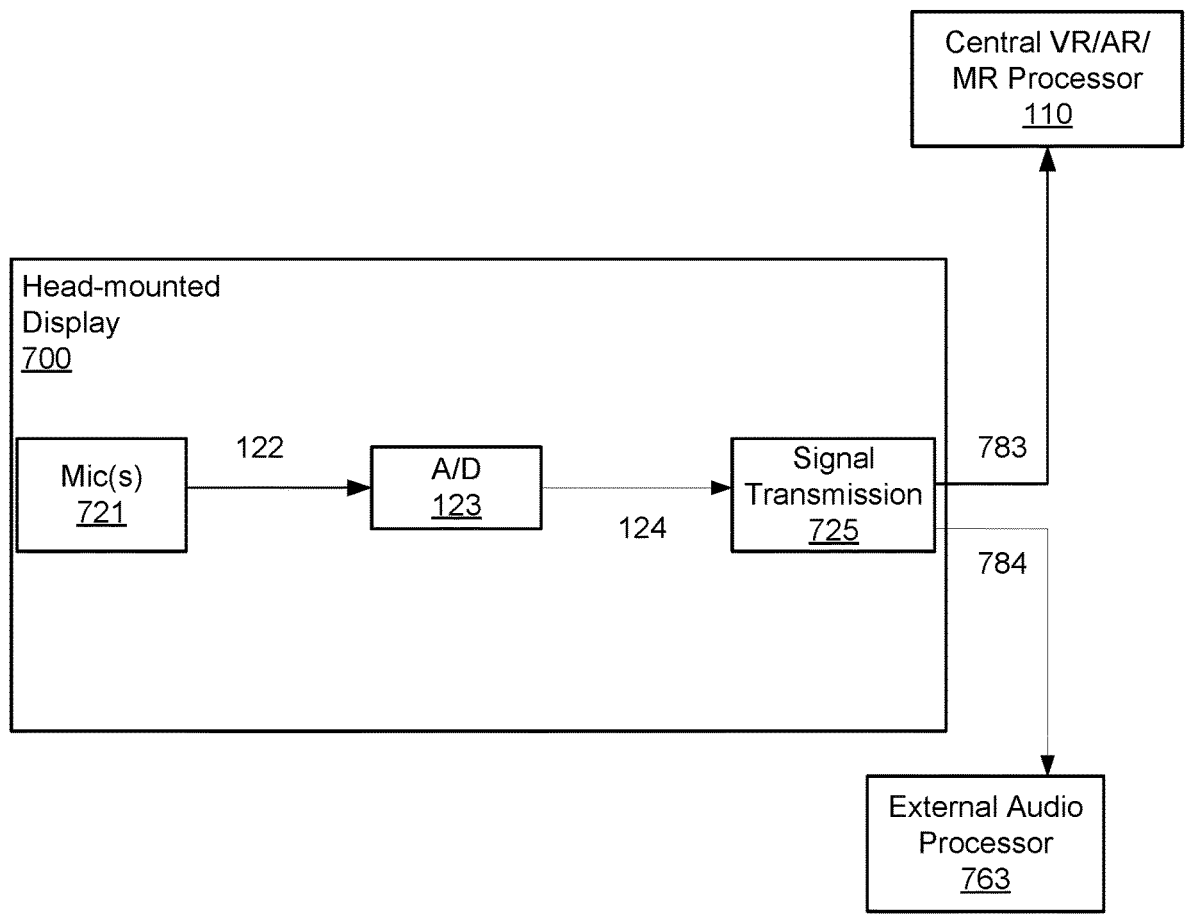
FIG. 7B is a schematic block diagram showing an exemplary first embodiment of the HMD device of FIG. 7A.

FIG. 7B is a schematic block diagram showing an exemplary first embodiment 700 of the HMD device of FIG. 7A. The microphones 721 produce analog signals 122 which may be conveyed via wire or wirelessly to an analog-to-digital converter 123 for conversion to digital signal(s) 124.

A signal transmission interface 725 receives the digital signal(s) 124. The signal transmission interface 725 may include wired outputs and/or wireless outputs such as Bluetooth, or Wi-Fi, among others. The signal transmission interface 725 provides a first output signal 783 to a central VR/AR/MR processor 110 (see, for example, the first embodiment described above), and a second output signal 784 to an external audio processor 763. The external audio processor 763 processes the acoustic data captured by the microphone(s) 721.

Figure 7C:
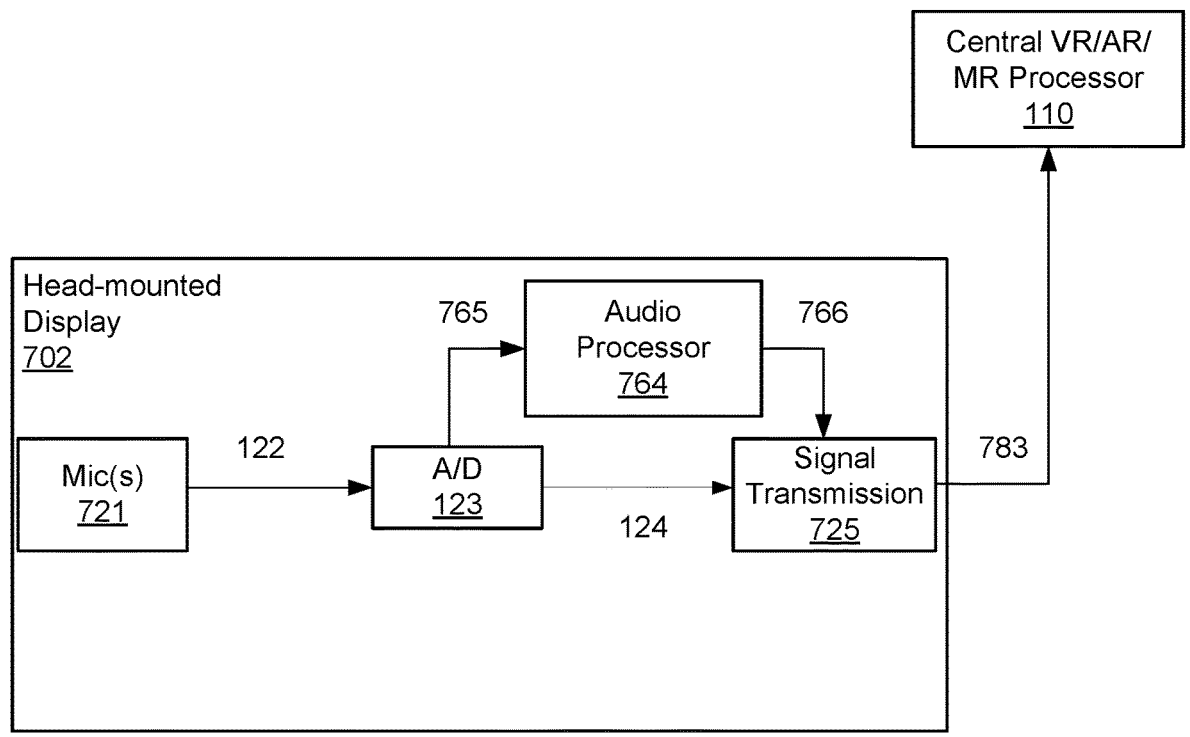
FIG. 7C is a schematic block diagram showing an exemplary second embodiment of the HMD device of FIG. 7A.

FIG. 7C is a schematic block diagram showing an exemplary second embodiment of an HMD device 702 that is a variation of the device depicted by FIG. 7A. The second HMD device 702 shares the following elements with the first HMD device 700:

Microphone(s) and/or microphone array(s) 721.
the analog to digital converter 123, and
the signal transmission interface 725.

Under the second embodiment HMD device 702, the ADC 123 sends a first digital signal 124 of the acoustic data captured by the microphone 721 to the signal transmission interface 725, and sends a second digital signal 765 of the acoustic data captured by the microphone 721 to an internal audio processor 764. The audio processor 764 may characterize and identify speech commands, calculate environmental noise levels, and/or may characterize the environment of the user, among others. The path for unprocessed microphone signals 124 may be used to send a direct speech recording such as a meeting discussion directly to a central processor to be saved in system memory. The audio processor 764 may characterize and identify speech commands, calculate environmental noise levels, and/or may characterize the environment of the user, among others. The path for unprocessed microphone signals 124 may be used to send a direct speech recording such as a meeting discussion directly to a central processor to be saved in system memory. The audio processor 764 conveys a processed digital signal 766 to the signal transmission interface 725. The signal transmission interface 725 may provide the signals 124, 766 to other HMD internal processes (not shown) such as a digital to analog converter for amplification to headphones. Similarly, the first digital signal 124 may be provided to additional processors in direct signal chain path between the ADC 123 and the signal transmission interface 725.

Under a third exemplary method embodiment, a pre-session calibration process does not produce a mapping of the physical environment (acoustic space). Instead, the method collects acoustic information as the user moves through the physical environment and adjusts the audio signals to loudspeakers (and headphones, if applicable) according to the current collected acoustic information.

Figure 8:
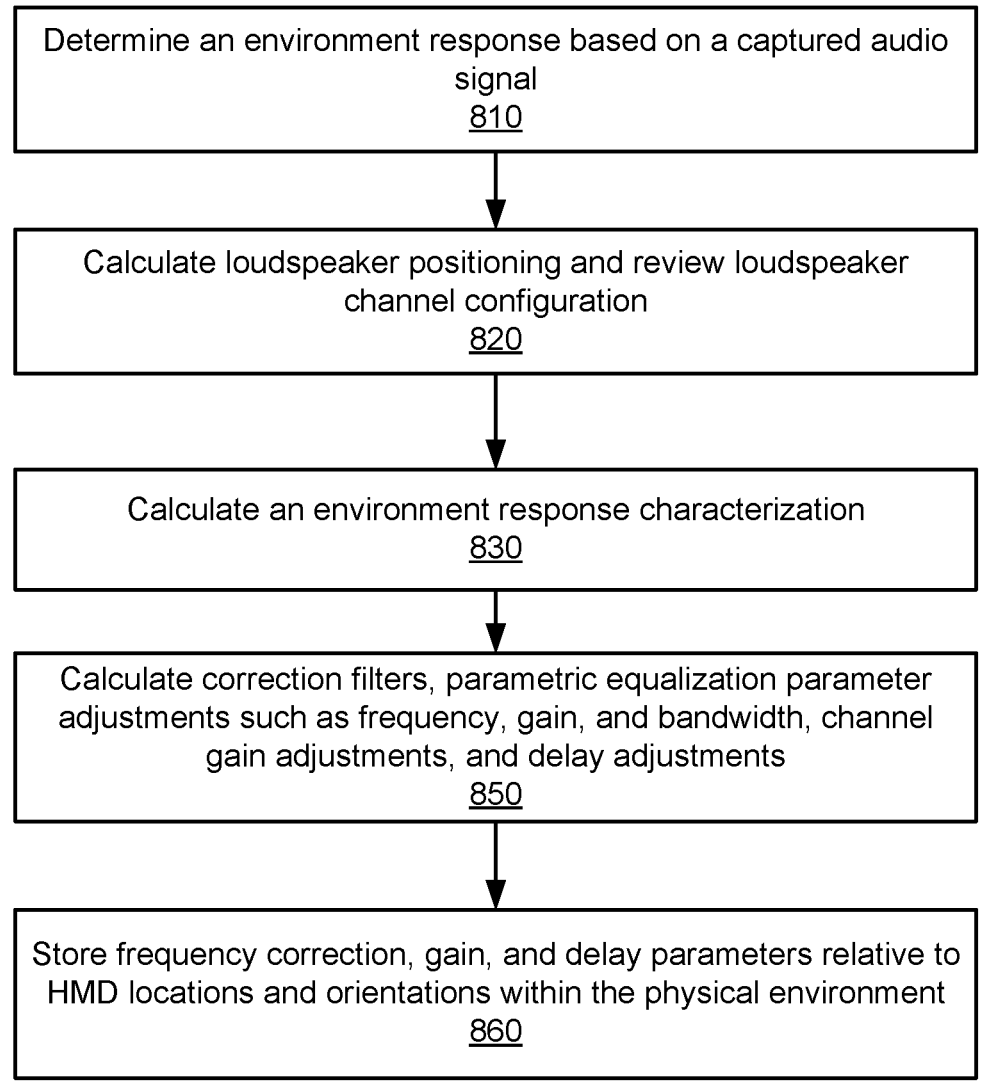
FIG. 8 is a flowchart of the exemplary third embodiment of a method for real-time acoustic adjustment to a VR/AR/MR system in response to user movements in acoustic environment.

FIG. 8 is a flowchart of the exemplary third embodiment of a method for real-time acoustic adjustment to a VR/AR/MR system in response to user movements in acoustic environment. The description of this method refers to elements of the system 100 of FIGS. 1A-1C. While the description is similarly applicable to the system 400 of FIG. 4 and the system 600 of FIG. 6, the following description refers to elements of the system 100 for clarity.

Parameters of the signal processing sub-system are initialized, for example, powering on the receiver 150, head-mounted display 120, controllers 110, 140, and other devices that utilize power in the system 100. The user uses the VR/AR/MR system 100 to experience the content she has chosen. During the VR/AR/MR session, the user may move around the environment. The VR/AR/MR system 100 collects acoustic information within the environment at different user locations. For example, the system may collect acoustic information based on detecting a user movement (change of location and/or orientation of the user), or the system may collect acoustic information according to a pre-defined time schedule, for example, by periodic polling.

An environment response is determined based on a captured audio signal, as shown by block 810. An environment frequency response (sometimes referred to as a "room frequency response," for the purpose of this method "environment frequency response" is used to denote the possibility of use in a partially or fully outdoor environment) is generated for each speaker channel at each user location and orientation. A FFT (Fast Fourier Transform) function may be performed on the acoustic data captured by the microphone array(s) to generate this response for each polling interval or movement parameter.

Loudspeaker positioning is calculated, and loudspeaker channel configuration is reviewed, as shown by block 820. Sound direction of arrival measurements are derived from the acoustic data captured by the array(s) to deconvolve the acoustic data and compare this data to the orientation and x, y, z coordinates of the user to determine the signal transmission of each channel.

An environment response characterization is calculated, as shown by block 830. The direction of arrival measurement to isolate the channel's transmission in the environment is subtracted from a real time analysis measurement of the signal being sent to the channel. This difference is considered an environmental distortion.

Delay may need to be introduced in the system to account for latency. The temporal difference between the signal being sent to the channel and the channel's transmission in the environment will be corrected for via delay adjustments, parametric equalization adjustments, gain adjustments, and/or the application of filters. At least one of a delay parameter, filter parameter, a parametric equalization parameter, a channel gain adjustment, and a summed gain adjustment is calculated and stored, as shown by block 850. The difference between the target response curve in the frequency domains and the FFTs for each location is used to determine any of the aforementioned parameters needed to match each channel output and/or the sum of all channels as close to the respective target curve as possible.

As shown by block 860, every parameter for each position and orientation is to be saved in the system's memory to be activated as the user's reenter's each position and orientation during their VR/AR/MR experience. Linear or non-linear interpolation will be used to determine parameters between saved positions and orientations that did not have calibration points measured between them. The greater the number of positions and orientations that are acquired, the greater the accuracy of the system to correct for environmental distortions throughout the user's experience. Blocks 810 through 860 may be repeated to ensure thorough calibration coverage of the space the user is utilizing with the VR/AR/MR system.

Figure 9:
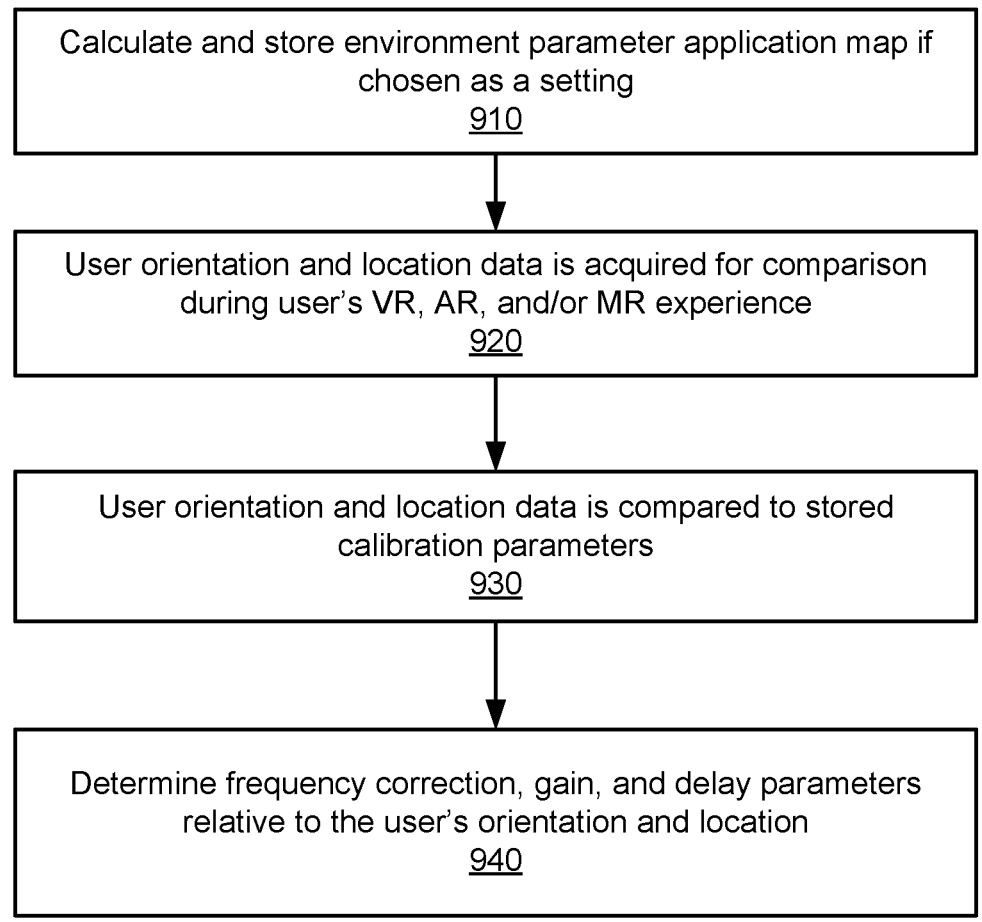
FIG. 9 is a flowchart of optional steps related to the exemplary third embodiment of FIG. 8.

FIG. 9 is a flowchart of optional steps related to FIG. 9 that may be performed once or repeated. As shown by block 910, every processed filter parameter, parametric equalization parameter, gain parameter, and delay parameter for each position and orientation may be saved in the system's memory to be activated as the user reenters the position and orientation during the user's VR/AR/MR experience. Linear or non-linear interpolation will be used to determine parameters between saved positions and orientations that did not have calibration points measured between them. New parameters resulting from interpolation or parameters that have been changed may be stored at locations and orientations throughout the user environment for activation during the user's VR/AR/MR experience.

As the user moves during the experience, the orientation and position data is acquired by the environment correction processing system, as shown by block 920. This orientation and positioning data is matched to the same orientation and position data from the saved real-time processing from earlier in the VR, AR, and/or MR experience of the user and the processing parameters are retrieved from the system's memory, as shown by block 930. The stored parameters are then applied to the audio signal(s), as shown by block 940.

The third embodied method utilizes direction of arrival to deconvolve acoustic data with processing such as an FFT to separate each channel from the sum of all channels at the microphone array. The method compares each separate deconvolved channel measurement to a real time analyzer measurement in the frequency domain of the audio signal being sent to each channel. The differences between the deconvolved measurement of each channel and the real time analyzer measurements of the audio signal are considered as environmental distortions. In alternative embodiments, the characterization and following correction occurs at a polling interval, for example, a polling interval defined by the user.

While the above described embodiments address the environmental distortion problem experienced by a user of an external loudspeaker virtual and/or mixed reality audio system, they are applicable in other scenarios, for example, home entertainment applications, defense industry applications, telehealth applications, and other commercial sector applications, among others. For example, in a home entertainment application, a user may incorporate a multi-channel loudspeaker system used for movies, music, television, and video games to function with a virtual and/or mixed reality HMD. This may occur in a residential room within an apartment or some type of home dwelling that would benefit from a correction system in order to correct for distortions introduced by the walls, ceiling, floor, and room objects such as furniture.

In an alternative embodiment, a user or location of a user within an environment may be determined by infrared cameras, wearable BTLE transmitters or other means. For non-VR applications such TV, Movies or conventional gaming, the advantages of dynamic audio performance optimization may be enjoyed without an HMD. The means and methods for user location dependent dynamic optimization are as described in this disclosure.

In defense industry applications, a virtual and/or mixed reality system may be used to pilot a remotely operated vehicle (ROV) or another remote device. These devices may be outfitted with microphones or other electroacoustic devices to convey information back to the user. It is important for performance that the directionality of threats and the clarity of communication signals are preserved by eliminating signal distortions in the control environment of the user. In telehealth applications, a patient and/or doctor may not be able to wear headphones in a remote diagnostic or remote surgery context and will need to utilize an external loudspeaker system with their virtual and/or mixed reality device. It is important that medical professionals are able to communicate between each other and with their patients as clearly as possible. Eliminating signal distortions introduced by the environment helps to meet that goal. In other commercial sector applications, such as retail, a product and/or service demonstration may include the use of virtual and/or mixed reality devices with an external multi-channel loudspeaker system. Whether this occurs at a customer residence or in a retail environment, the elimination of environmental distortions can preserve the intended audiovisual experience.

Previous methods, for example as described in U.S. Patent Publication No. 2021/0044916 A1, utilize camera devices with a virtual and/or mixed reality headset to determine the geometry of the user's environment. The visually mapped geometry is then matched the closest fitting 3D model from a database. An adaptive filter is then applied to the audio signal based on the match to the 3D model. In contrast, the above-described embodiments are based on measured acoustics, rather than just room geometry. Since density of room structures with similar geometries may differ, this difference in density distorts the signal differently and will be characterized more accurately by the acoustic-based analysis of the embodiments here than from using an image-based analysis. Advantageously, unlike an image analysis system, the direction of arrival analysis of the present embodiments can determine whether the loudspeaker system is setup properly.

While the above embodiments have generally been described in the context of an indoor environment (acoustic space), the embodiments are also applicable to outdoor and/or partially outdoor systems, with appropriate adjustments and understood by a person having ordinary skill in the art. For example, it may be desirable for outdoor system to have a signal to noise measurement to ensure the gain from each channel on the order of roughly 10-20 dB above a noise floor down to a specified frequency for each channel. This frequency may be lower for specific channels such as a subwoofer. Signal loss may require additional gain adjustments in specific frequency regions. In certain systems a reflective surface may exist in which peaks and/or nulls are smoothed as described previously.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A virtual reality (VR), augmented reality (AR) and/or mixed reality (MR) system in a physical environment comprising a plurality of loudspeakers, comprising:
   a user-worn head mounted display (HMD), further comprising:
      a microphone; and
      a user tracking device configured to track an orientation and position of the user within the physical environment;
   a VR/AR/MR processor configured to deliver a digital video signal to the head-mounted display, and a digital control signal and a digital audio signal to a receiver/preamplifier;
   a VR/AR/MR user tracking processor configured to receive user tracking data from the HMD user tracking device and provide a digital user tracking data signal to the receiver/preamplifier;
   the receiver/preamplifier configured to receive the digital user tracking data signal, the digital control signal, the digitized microphone signal, and the digital audio signal, and to provide a processed audio signal to an amplifier,
   wherein the receiver/preamplifier is further configured to comprise:
      a system memory;
      a central receiver processor; and
      an analog signal processor;
   wherein the receiver/preamplifier further comprises an environment correction processor configured to characterize the environment according to tracked movements of a user in the environment; and
   the amplifier configured to receive the processed audio signal and provide a plurality of amplified audio signals.

2. The system of claim 1, further comprising the plurality of loudspeakers configured to receive the plurality of amplified audio signals.

3. The system of claim 1, further comprising:
   a headphone preamplifier configured to receive a digital headphone signal from the receiver/preamplifier;
   a headphone digital-to-analog converter in communication with the headphone preamplifier; and
   a headphone amplifier configured to receive and amplify an analog headphone signal from the headphone digital-to-analog converter.

4. A virtual reality (VR), augmented reality (AR) and/or mixed reality (MR) system in a physical environment comprising a plurality of loudspeakers, comprising:
   a user-worn head mounted display (HMD), further comprising:
      a microphone; and
      a user tracking device configured to track an orientation and position of the user within the physical environment;
   wherein the HMD is further configured to comprises:
      an audio processor configured to receive an input signal from a central VR/AR/MR processor; and
      an environment correction processor configured to:
         receive microphone data and audio processor data;
         characterize the environment according to the microphone data; and
         apply correction parameters to the audio processor data;
      a digital-to-analog converter configured to receive a digital audio signal from the audio processor; and
      a headphone amplifier configured to receive and amplify an analog audio signal from the digital-to-analog converter;
   a VR/AR/MR processor configured to deliver a digital video signal to the head-mounted display, and a digital control signal and a digital audio signal to a receiver/preamplifier;
   a VR/AR/MR user tracking processor configured to receive user tracking data from the HMD user tracking device and provide a digital user tracking data signal to the receiver/preamplifier;

the receiver/preamplifier configured to receive the digital user tracking data signal, the digital control signal, the digitized microphone signal, and the digital audio signal, and to provide a processed audio signal to the an amplifier; and an the amplifier configured to receive the processed audio signal and provide a plurality of amplified audio signals.

5. The system of claim 4, further comprising:

a headphone preamplifier configured to receive a digital headphone signal from the receiver/preamplifier;

a headphone digital-to-analog converter in communication with the headphone preamplifier; and a headphone amplifier configured to receive and amplify an analog headphone signal from the headphone digital-to-analog converter.

\* \* \* \* \*